United States Patent
Pang et al.

(10) Patent No.: US 7,329,907 B2
(45) Date of Patent: Feb. 12, 2008

(54) PHOSPHOR-CONVERTED LED DEVICES HAVING IMPROVED LIGHT DISTRIBUTION UNIFORMITY

(75) Inventors: Siew It Pang, Penang (MY); Meng Ee Lee, Penang (MY); Kian Shin Lee, Penang (MY); Su Lin Oon, Penang (MY); Hong Huat Yeoh, Penang (MY)

(73) Assignee: Avago Technologies, ECBU IP Pte Ltd, Singapore (SG)

( * ) Notice: Subject to any disclaimer, the term of this patent is extended or adjusted under 35 U.S.C. 154(b) by 182 days.

(21) Appl. No.: 11/202,440

(22) Filed: Aug. 12, 2005

(65) Prior Publication Data

US 2007/0034887 A1     Feb. 15, 2007

(51) Int. Cl.
  *H01L 29/22*    (2006.01)
  *H01L 23/00*    (2006.01)
  *H01L 29/04*    (2006.01)
  *H01L 33/00*    (2006.01)

(52) U.S. Cl. .................. 257/99; 257/100; 257/E33.005; 257/E33.058; 257/E33.059

(58) Field of Classification Search ............... 257/99, 257/100, E33.005, E33.058, E33.059
See application file for complete search history.

(56) References Cited

U.S. PATENT DOCUMENTS

| | | |
|---|---|---|
| 6,998,771 B2 | 2/2006 | Debray et al. |
| 2004/0069999 A1 | 4/2004 | Lin et al. |
| 2005/0057144 A1 | 3/2005 | Morita et al. |
| 2005/0077532 A1 | 4/2005 | Ota et al. |
| 2005/0156496 A1* | 7/2005 | Takashima et al. ......... 313/237 |
| 2006/0067073 A1* | 3/2006 | Ting .......................... 362/231 |
| 2006/0186425 A1* | 8/2006 | Yano et al. ................. 257/98 |
| 2007/0023769 A1* | 2/2007 | Nishimoto et al. ......... 257/88 |

FOREIGN PATENT DOCUMENTS

| | | |
|---|---|---|
| EP | 0 936 682 A1 | 8/1999 |
| EP | 1 378 555 A1 | 1/2004 |
| EP | 1 480 278 A2 | 11/2004 |
| JP | 2004-95969 A | 3/2004 |
| WO | WO97/50132 | 12/1997 |
| WO | WO 97/50132 A1 | 12/1997 |
| WO | WO98/05078 | 2/1998 |
| WO | WO98/12757 | 3/1998 |
| WO | WO 98/12757 A1 | 3/1998 |
| WO | WO 2004/021459 A1 | 3/2004 |
| WO | WO 2004/077580 A2 | 9/2004 |

OTHER PUBLICATIONS

Hur et al., "White LED", HTML and PDF versions, 9 pgs, printed from the internet on Oct. 11, 2006 from http://www.mse.berkeley.edu/classes/matsci102/F01reports/whiteled.pdf.

"Introduction to Light Emitting Diodes", Optical Microscopy Primer: Physics of Light and Color, 26 pgs., printed from the internet on Oct. 11, 2006 from http://micro.magnet.fsu.edu/primer/lightandcolor/ledsintro.html.

* cited by examiner

*Primary Examiner*—Ngân V. Ngô

(57) ABSTRACT

A New Phosphor-converted LED Device ("NPCLD") is disclosed. The NPCLD may include a lens over a phosphor body, in which the lens and the phosphor body each have a substantially convex upper surface. The NPCLD may alternatively include first and second lenses, the first lens having a substantially flat interface with a phosphor body.

12 Claims, 8 Drawing Sheets

PHOSPHOR-CONVERTED LED DEVICES HAVING IMPROVED LIGHT DISTRIBUTION UNIFORMITY

BACKGROUND OF THE INVENTION

Phosphor-converted light emitting diode ("LED") devices are useful for generating light output having actual and perceived spectral characteristics that differ from the actual spectral characteristics of the LEDs themselves. For example, the advent of blue LEDs was a key development in the quest for LED devices emitting apparently white light, as potential replacements for incandescent and fluorescent bulbs. Blue LEDs have been integrated with yellow phosphors to emit blue and yellow photons in ratios that are perceived by the human eye as white light. Although these photonic emissions do not span the complete visible spectrum and therefore are not actually equivalent to sunlight, they appear to be white and thus may be effectively utilized, for example in lighting applications. Since LED devices may convert electricity into photonic emissions more efficiently than incandescent and fluorescent bulbs, the potential benefits of LED use for lighting and other applications in terms of energy conservation are great. Further, as solid state devices, LED devices have a larger average lifetime of use than and often are more resistant to physical damage than are conventional incandescent and fluorescent bulbs.

Phosphor-converted LED devices typically emit photons having at least two discrete wavelengths, which are generated by at least two different sources that are located close to, but not in identical positions as, each other. One source is electroluminescent radiation from the LED itself; another is luminescent radiation from the phosphor, as stimulated by radiation from the LED. Unfortunately, the non-unity of both the physical positioning and the functional operation of these photonic sources generally results in non-uniformity in the additive photonic emissions from conventional phosphor-converted LED devices, producing an unwanted wide white color bin spread.

As an example, the structure of a conventional phosphor-converted LED device may include an LED that is overlaid by a selected phosphor. In an example of operation, the electroluminescent emissions from the LED at one wavelength are partially intercepted by the phosphor, resulting in stimulated luminescent emissions from the phosphor that are usually at a longer wavelength. Photons emitted by the LED at a first wavelength and by the phosphor at a second wavelength are then additively emitted from the phosphor-converted LED device. It is appreciated by those skilled in the art that the LED may be designed to emit blue photons, and the phosphor may be designed to emit yellow photons, in ratios where the additive output is perceived by the human eye as white light.

In an example of fabricating a phosphor-converted LED device, the phosphor is dispersed in a suitable encapsulant in a liquid phase and then deposited onto the LED. The phosphor generally migrates downward in the encapsulant following deposition, as the encapsulant cures to a solid form. This migration often leads to uneven layering of the phosphor over the LED, which results in a phosphor-converted LED device producing a wide white color bin spread. As an example of problems associated with this conventional fabrication method, if the shape of the LED is a rectangular prism, then the phosphor may sink to the bottom of the phosphor-encapsulant dispersion to the point that further migration of the phosphor is partially impeded by the LED itself. As this impedance develops while the phosphor dispersion cures, the phosphor may become unevenly distributed across the upper surface of the LED rectangular prism onto which it sinks. In particular, portions of the sinking phosphor that clear the outer edges of the top surface of the LED may further sink below that surface. As a result, the thickness of the phosphor layer may be decreased near the outer edges. Upon stimulation of electroluminescent emissions from the LED itself, this decreased thickness may result in reduced capacity by the phosphor near the outer edges to convert the photons emitted by the LED by stimulated emissions. This reduced capacity imbalances the desired ratio between blue and yellow photons emitted from the phosphor-converted LED device in regions over the outer edges, because the yellow photonic emissions there are reduced. Hence, a wide white color bin spread may result and a blue halo may be generated in the photonic output of the phosphor-converted LED device, roughly conforming to the locations of the thin regions in the phosphor near such outer edges. This blue halo constitutes a non-uniformity in the light output from the phosphor-converted LED device that may be both aesthetically and functionally undesirable in use of the device.

Therefore, as phosphor-converted LED devices are implemented for diverse end use applications, there is a continuing need to provide new phosphor-converted LED device structures generating photonic emissions of improved uniformity.

SUMMARY

A New Phosphor-Converted LED Device ("NPCLD") is described. The NPCLD may include a concave base housing, light emitting diode ("LED") in the concave base housing, phosphor body over the LED, and a first lens over the phosphor body. The LED may include a p-doped semiconductor body and an n-doped semiconductor body, and the phosphor body may have a substantially convex upper surface, and the first lens may have a substantially convex upper surface.

Alternatively, the NPCLD may include a concave base housing, LED in the concave base housing, phosphor body over the LED, first lens over the LED, and second lens over the phosphor body and over the first lens. The LED may include a p-doped semiconductor body and an n-doped semiconductor body, and the phosphor body may have a substantially flat upper surface. Additionally, the first lens may have a substantially flat upper surface, and the second lens may include a substantially convex upper surface. Moreover, the first lens and the phosphor body together may have a substantially flat interface.

As an example, the NPCLD may be fabricated by producing a concave base housing and placing the LED in the concave base housing where the LED may include a p-doped semiconductor body and an n-doped semiconductor body. A phosphor body may be formed over the LED and a first lens may be formed over the LED, where the first lens may have a substantially flat upper surface. Additionally, a second lens may be formed over the phosphor body and over the first lens, where the second lens may have a substantially convex upper surface, and the first lens and the phosphor body may be shaped to have a substantially flat interface.

In an additional implementation example, a method for fabricating the NPCLD may include forming a phosphor body having a substantially convex upper surface over an LED, and forming a lens over the phosphor body having a substantially convex upper surface.

Other systems, methods and features of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The invention can be better understood with reference to the following figures. The components in the figures are not necessarily to scale, emphasis instead being placed upon illustrating the principles of the invention. In the figures, like reference numerals designate corresponding parts throughout the different views.

DETAILED DESCRIPTION

In the following description of various implementations, reference is made to the accompanying drawings that form a part of this disclosure, and which show, by way of illustration, specific implementations in which the invention may be practiced. Other implementations may be utilized and structural changes may be made without departing from the scope of the present invention.

Figure 1:
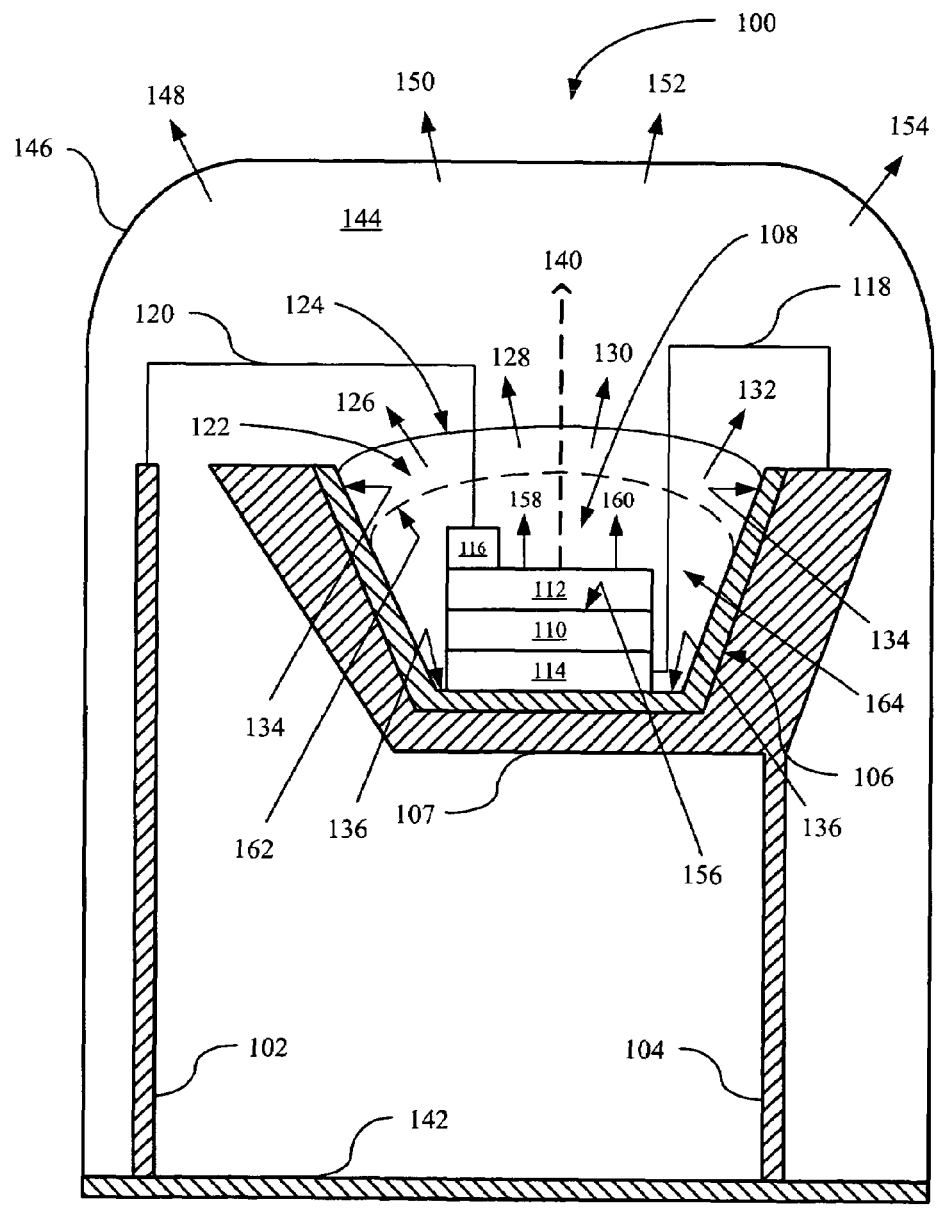
FIG. 1 shows a cross-sectional view of an example of an implementation of a new phosphor-converted LED device ("NPCLD")

In FIG. 1, a cross-sectional view of an example of an implementation of a new phosphor-converted LED device ("NPCLD") 100 is shown in accordance with the invention. The NPCLD 100 includes an anode 102 and a cathode 104. The cathode 104 includes a concave (i.e., bowl and/or cup-shaped) base housing 106 formed of an electrical insulator and supported on a frame 107, in which an LED 108 is placed. The frame 107 may be integrated with the cathode 104, and may be fabricated, for example, from lead. It will be understood by those skilled in the art that the frame 107 may alternatively be any form of printed circuit board, such as, for example, one fabricated of FR4, FR5, bismaleimide/triazine (BT), polyimide, metal core. It is also understood that the frame 107 may instead be in another form, such as for example a metal coated ceramic frame, a plastic substrate, or a lead frame with a plastic body or cavity. The LED 108 may include a p-doped semiconductor body 110 and an n-doped semiconductor body 112. It is appreciated by those skilled in the art that the term "body" broadly means and includes all forms of a mass of a subject device element, such as, for example, a layer, multiple layers, a coating, a casting, or a block, of any suitable dimensions, however formed. In an example of an implementation, the shape of the LED 108 may be a rectangular prism. In other examples, the shape of the LED 108 may be cubic, cylindrical, or have another desirable geometric shape. In an example of an implementation, more than one LED 108 may be placed in the concave base housing 106.

The p-doped semiconductor body 110 may be in signal communication with a base conductor 114 and the n-doped semiconductor body 112 may be in signal communication with a top conductor 116. The base conductor 114 and top conductor 116 allow current to flow in and out of the p-doped semiconductor body 110 and n-doped semiconductor body 112, respectively. A cathode bonding wire 118 may electrically connect the cathode 104 to the base conductor 114 placing the cathode 104 in signal communication with the base conductor 114. Similarly, an anode bonding wire 120 may electrically connect the anode 102 to the top conductor 116. In an example of an implementation, more than one cathode bonding wire 118 and/or more than one anode bonding wire 120 may be used. In an alternative implementation example, the concave base housing 106 may be formed of an electrical conductor, and the base conductor 114 and the cathode bonding wire 118 may be omitted. It will be appreciated that in an alternative example structure for the NPCLD, the semiconductor body 112 may be p-doped and the semiconductor body 110 may be n-doped. A current flow through the LED 108 in such an alternative structure may be reversed, so that the NPCLD 100 may include an anode 104 and a cathode 102. In another implementation example, the cathode 104 may be replaced by a first terminal 104 at a relatively high electrical potential in signal communication with the p-doped semiconductor body 110; and the anode 102 may be replaced by a second terminal 102 at a relatively low electrical potential in signal communication with the n-doped semiconductor body 112. The LED 108 may be substantially covered by a phosphor body 122 formed from a composition including a phosphor and a phosphor encapsulant. By "substantially" is meant that only a minor portion or none of the surface of the covered element of the NPCLD is exposed through the covering material. The phosphor body 122 may have a phosphor domed surface 124 forming a substantially convex lens for example photonic emissions 126, 128, 130 and 132 from the phosphor body 122. It is appreciated that the phrase "substantially convex" means that the phosphor body 122 has a generally convex shape, which may include minor imperfections. The inner walls (such as side inner wall 134 and base inner wall 136) of the concave base housing 106 form a reflector for the photons emitted by both the LED 108 and the phosphor body 122. The reflector generally deflects these photons in a direction 140 of maximum photonic radiation from the NPCLD 100. As an example, the base inner wall 136 may have a circular circumference and the concave base housing 106 may also have a circular circumference. It is appreciated, however, that the base inner wall 136 and the concave base housing 106 may also have circumferences of other shapes. For example, the base inner wall 136 may have a circumference that is elliptical, quadrilateral, or of some other geometric shape. Desirably, the circumference of the base inner wall 136 has at least one axis of symmetry, and desirably the shape of the circumference of the concave base housing 106 is similar to that of the base inner wall 136. The anode 102 and cathode 104 of the NPCLD 100 may be supported on a base 142, and collectively encapsulated in a diffused lens 144 having an encapsulation domed surface 146 forming a substantially convex lens for example photonic emissions 148, 150, 152 and 154 from the NPCLD 100.

In an example of operation, a bias current is applied across the anode 102 and cathode 104 by an external power source, not shown. The bias current induces charge carriers to be transported across the interface 156 between the n-doped semiconductor body 112 and the p-doped semiconductor body 110. Electrons flow from the n-doped semiconductor body 112 to the p-doped semiconductor body 110, and holes are generated in the opposite direction. Electrons injected into the p-doped semiconductor body 110 recombine with the holes, resulting in electroluminescent emission of photons such as example photons 158 and 160 from the LED 108. Some of these photons pass through the phosphor body 122 and are emitted through the encapsulation domed surface 146. Other photons stimulate luminescent emission of new photons such as example photons 126, 128, 130 and 132 by the phosphor in the phosphor body 122. The combination of the phosphor domed surface 124, forming a substantially convex lens, and the encapsulation domed surface 146, forming a substantially convex lens, function together to accentuate uniformity of the spectral distribution and intensity of photons emitted from the encapsulation domed surface 146 of the NPCLD 100.

In an example of an implementation, sufficient phosphor may be utilized in the composition to form the phosphor body 122 so that phosphor substantially covers the LED 108. Furthermore, the phosphor may be selected to have a relatively higher density (or specific gravity) than the encapsulant in which it is dispersed, so that the phosphor sinks to the bottom of the phosphor body 122. As indicated by the dotted line 162, in this implementation example the phosphor forms a dome shaped portion 164 of the phosphor body 122. Formation of the phosphor into the dome shaped portion 164 of the phosphor body 122 further accentuates uniformity of electroluminescent photonic emissions from the phosphor body 122.

The substantially convex phosphor domed surface 124 of the phosphor body 122 accentuates the output of photons into the diffused lens 144. It is appreciated that according to Snell's Law, light travels from a medium of higher refractive index into a medium of lower refractive index only if it intersects the interface between the two media at an angle less than the critical angle for the two media. The curvature of the substantially convex phosphor domed surface 124 causes most photons leaving the phosphor body 122 to meet the substantially convex phosphor domed surface 124 at nearly right angles, so that the photons enter the diffused lens 144 with little reflection loss.

The choice of materials for fabricating the LED 108 is generally determined by the desired end use application for the NPCLD 100. For example, if photonic emissions interpreted by the human eye as white light are desired, the LED may be designed to emit blue light. Gallium nitride- ("GaN-") or indium-gallium-nitride ("InGaN-") based LED semiconductor chips emitting blue light with an emission maximum broadly within a range of about 420 nanometers ("nm") to about 490 nm, or more particularly within a range of about 430 nm to about 480 nm, may be utilized. The term "GaN- or InGaN-based LED" is to be understood as being an LED whose radiation-emitting region contains GaN, InGaN and/or related nitrides, together with mixed crystals based on such nitrides, such as Ga(Al—In)N, for example. Such LEDs are known, for example, from Shuji Nakamura and Gerhard Fasol, "The Blue Laser Diode", Springer Verlag, Berlin/Heidelberg, 1997, pp. 209 et seq., the entirety of which hereby is incorporated herein by reference. In an alternative implementation example, a polymer LED or laser diode may be utilized instead of the semiconductor LED. It is appreciated that the term "light emitting diode" is defined as encompassing and including semiconductor light emitting diodes, polymer light emitting diodes, and laser diodes.

Similarly, the choice of phosphors for excitation by some of the blue photons emitted by the LED also may be determined by the desired end use application for the NPCLD 100. As an example, if photonic emissions interpreted by the human eye as white light are desired, the selected phosphor may be designed to emit yellow light. When combined in appropriate ratios at appropriate wavelengths as shown, for example, in chromaticity charts published by the International Commission for Illumination, the blue and yellow photons appear together as white light. In this regard, yttrium aluminum garnet ("YAG") is a common host material, and is usually doped with one or more rare-earth elements or compounds. Cerium is a common rare-earth dopant in YAG phosphors utilized for white light emission applications.

In an example of an implementation, the selected phosphor may be a cerium-doped yttrium-aluminum garnet including at least one element such as yttrium, lutetium, selenium, lanthanum, gadolinium, samarium, or terbium. The cerium-doped yttrium-aluminum garnet may also include at least one element such as aluminum, gallium, or indium. In an example of another implementation, the selected phosphor may have a cerium-doped garnet structure A3B5O12, where the first component "A" represents at least one element such as yttrium ("Y"), lutetium ("Lu"), selenium ("Se"), lanthanum ("La"), gadolinium ("Gd"), samarium ("Sm"), or terbium ("Tb") and the second component "B" represents at least one element such as aluminum (Al), gallium (Ga), or indium (In). These phosphors may be excited by blue light from the LED 108 and in turn may emit light whose wavelength is shifted into the range above 500 nm, ranging up to about 585 nm. As an example, a phosphor may be utilized having a wavelength of maximum emission that is within a range of about 550 nm to about 585 nm. In the case of cerium-activated Tb-garnet luminescent materials, the emission maximum may be at about 550 nm. Relatively small amounts of Tb in the host lattice may serve the purpose of improving the properties of cerium-activated luminescent materials, while larger amounts of Tb may be added specifically to shift the emission wavelength of cerium-activated luminescent materials. A high proportion of Tb is therefore well suited for white phosphor-converted LED devices with a low color temperature of less than 5000 K. For further background information on phosphors for use in phosphor-converted LED devices, see for example: WO 98/05078; WO 97/50132; WO 98/12757; and WO 97/50132, which are herein incorporated by reference in their entirety.

As an example, a blue-emitting LED based on gallium nitride or indium-gallium nitride, with emission maxima within a range of about 430 nm to about 480 nm, may be utilized to excite a luminescent material of the YAG:Ce type with emission maxima within a range of about 560 nm to about 585 nm.

Disclosed are various examples of implementations where a NPCLD is designed to combine blue photons generated by LED 108 electroluminescence and yellow photons generated from blue photon-stimulated phosphor 122 luminescence, in order to provide light output having a white appearance. However, it is appreciated that NPCLDs operating with different chromatic schemes may also be designed for producing light that appears to be white or appears to have another color. Light that appears to be white may be realized through many combinations of two or more colors generated by LED 108 electroluminescence and photon-stimulated phosphor 122 luminescence. One example method for generation of light having a white appearance is to combine light of two complementary colors in the proper power ratio. With regard to the LED 108 itself, photon-emitting diode p-n junctions are typically based on two selected mixtures of Group III and Group V elements, such as gallium arsenide, gallium arsenide phosphide, or gallium phosphide. Careful control of the relative proportions of these compounds, and others incorporating aluminum and indium, as well as the addition of dopants such as tellurium and magnesium, enables production of LEDs that emit, for example, red, orange, yellow, or green light. As an example, the following semiconductor compositions may be utilized to generate photons in the indicated spectral ranges: gallium-aluminum-arsenide/gallium arsenide (epitaxial layers/LED substrate; output wavelength 880 nm, infrared); gallium-aluminum-arsenide/gallium-aluminum-arsenide (660 nm, ultra red); aluminum-gallium-indium-phosphide (epitaxial layers; output wavelength 633 nm, super red); aluminum-gallium-indium-phosphide (612 nm, super orange); gallium-arsenide/gallium-phosphide (605 nm, orange); gallium-arsenide-phosphide/gallium-phosphide (585 nm, yellow); indium-gallium-nitride/silicon-carbide (color temperature 4500K, incandescent white); indium-gallium-nitride/silicon-carbide 6500K, pale white); indium-gallium-nitride/silicon-carbide (8000K, cool white); gallium-phosphide/gallium-phosphide (555 nm, pure green); gallium-nitride/silicon-carbide (470 nm, super blue); gallium-nitride/silicon-carbide (430 nm, blue violet); and indium-gallium-nitride/silicon-carbide (395 nm, ultraviolet).

As an example, a phosphor selected as discussed above may be dispersed in an encapsulant, forming a phosphor-encapsulant composition for deposition onto the LED 108 in the fabrication of the NPCLD 100. The encapsulant is at least partially transparent to the generated photonic radiation. As an example of an implementation, the encapsulant may be a curable polymeric resin, such as an epoxy, silicone or acrylate resin (such as polymethyl-methacrylate for example), or a mixture of such resins. In an example of another implementation, the encapsulant may be another photonic radiation-transmissive material, such as an inorganic glass that may be in the form of a sol-gel, for example.

Figure 2:
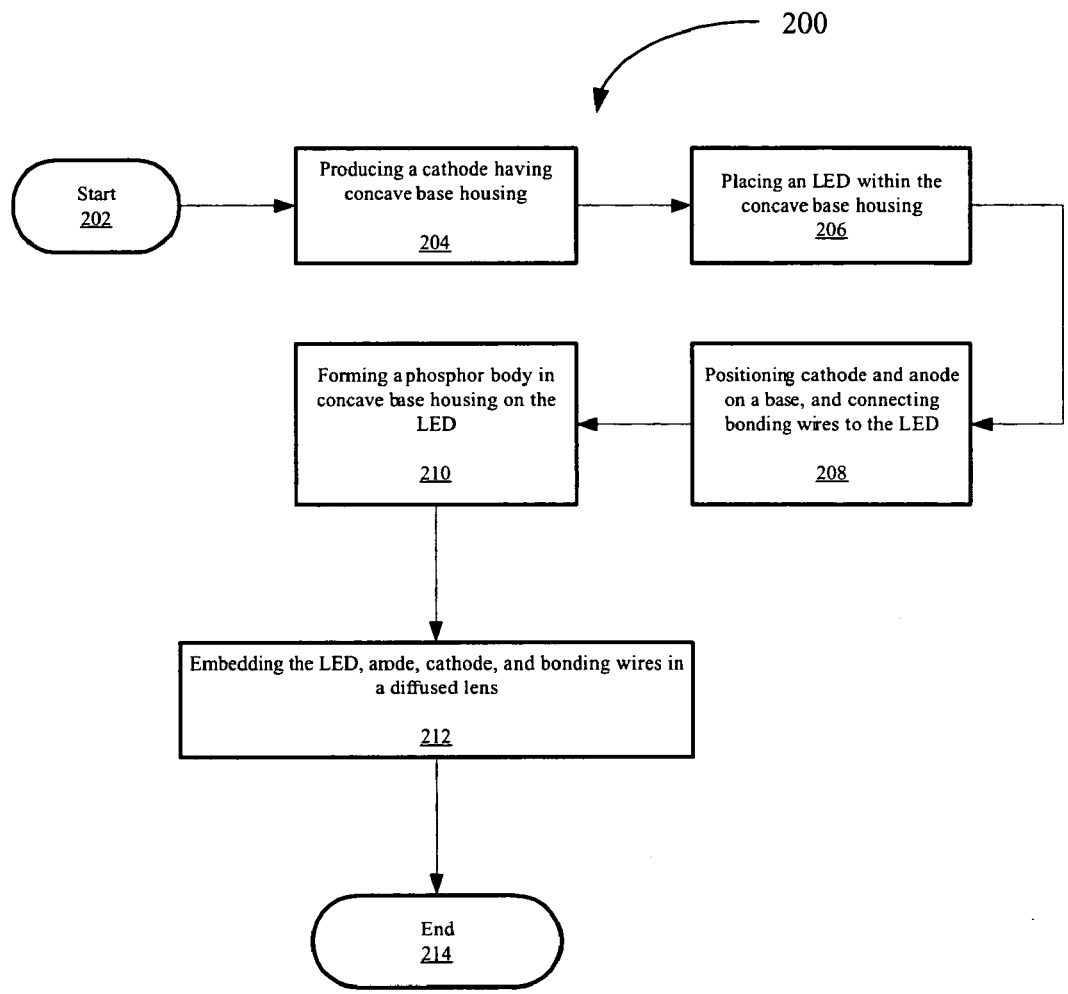
FIG. 2 shows a flowchart illustrating an example of an implementation of a method for fabricating the NPCLD shown in FIG. 1.

In FIG. 2, a flowchart 200 is shown illustrating an example of an implementation of a process for fabricating the new NPCLD 100 shown in FIG. 1. The process begins in step 202, and in step 204, a cathode 104 having a concave base housing 106 is produced, wherein the concave base housing 106 has photon-reflective side inner wall 134 and base inner wall 136. An LED 108 is placed within the concave base housing 106 on the base inner wall 136, in step 206. The LED may be pre-made, or formed in situ. The LED 108 may be positioned at a point on the base inner wall 136 substantially equidistant from all points at which base inner wall 136 meets side inner wall 134. The LED 108 may be fabricated using various known techniques such as, for example, liquid phase epitaxy, vapor phase epitaxy, metal-organic epitaxial chemical vapor deposition, or molecular beam epitaxy. In step 208, the cathode 104 and anode 102 are positioned on a base 142, and bonding wires 118 and 120 are connected to the conductors 114 and 116 and to the cathode 104 and anode 102, respectively. It is appreciated that either all or a portion of step 208 may be performed later in the process without departing from the method. A phosphor-encapsulant composition is then formulated as discussed above. As an example, the concentration of phosphor in the phosphor-encapsulant composition may be sufficiently high so that upon formation of the phosphor body 122, sufficient phosphor is deposited within the concave base housing 106 to substantially cover the LED 108 as shown by the dotted line 162, FIG. 1. In this example, the presence of the LED 108 onto which the phosphor sinks further contributes to the occupation by the phosphor of a sub-body within the phosphor body 122 having a substantially convex surface defined by the dotted line 162. In step 210, a phosphor body 122 is formed within the concave base housing 106 on the LED 108. In this example of an implementation, the phosphor body 122 is formed to have a substantially convex phosphor domed surface 124. As an example, the phosphor body 122 may be molded or cast into the desired shape. In step 212, the LED 108, anode 102, cathode 104, and bonding wires 118 and 120 of the NPCLD 100 are embedded in a diffused lens 144. The process then ends in step 214. The diffused lens may be fabricated from an encapsulant as discussed earlier, having dispersed light-scattering particles such as titanium dioxide or silicon dioxide particles. Additionally, the diffused lens 144 may be formed with the desired dome shape, for example, by molding or casting.

Figure 3:
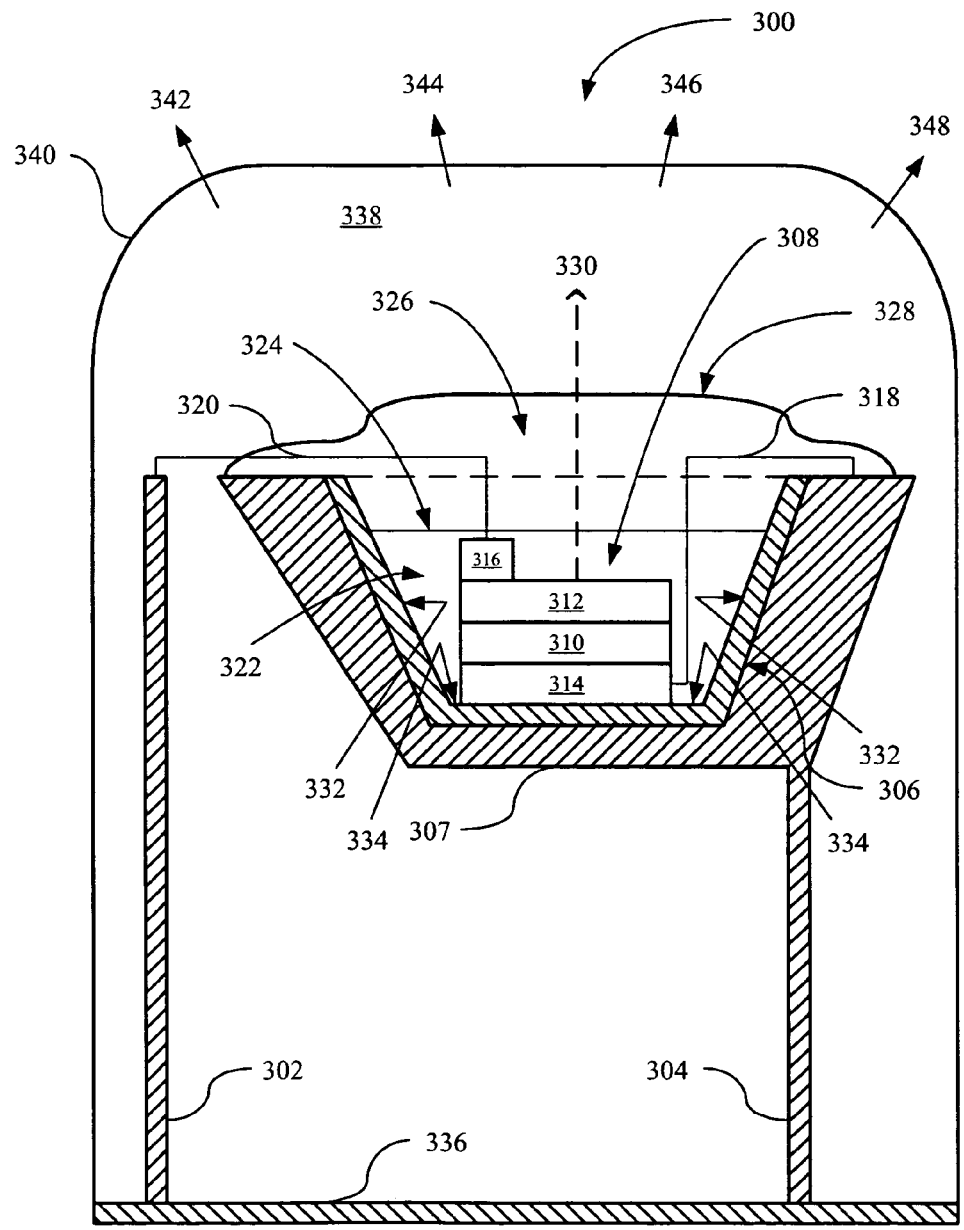
FIG. 3 shows a cross-sectional view of an example of another implementation of the NPCLD.

In FIG. 3, a cross-sectional view of an example of another implementation of a new NPCLD 300 is shown. The NPCLD 300 includes an anode 302, and a cathode 304. Similar to FIG. 2, the cathode 304 includes a concave base housing 306 formed of an electrical insulator and supported on a frame 307, in which an LED 308 is placed. The frame 307 may be integrated with the cathode 304, and may be fabricated, for example, from lead or another material as earlier discussed. The LED 308 includes a p-doped semiconductor body 310 and an n-doped semiconductor body 312. In an example of an implementation, more than one LED 308 may be placed in the concave base housing 306.

The p-doped semiconductor body 310 may be in signal communication with a base conductor 314 and the n-doped semiconductor body 312 may be in signal communication with a top conductor 316. A cathode bonding wire 318 may electrically connect the cathode 304 to the base conductor 314 placing the cathode 304 in signal communication with the base conductor 314. An anode bonding wire 320 may electrically connect the anode 302 with the top conductor 316 placing the anode 302 in signal communication with the top conductor 316 In an example of an implementation, more than one cathode bonding wire 318 and/or more than one anode bonding wire 320 may be used. Similar to FIG. 1, the base conductor 314 and top conductor 316 allow current to flow in and out of the p-doped semiconductor body 310 and n-doped semiconductor body 312, respectively. In an alternative implementation example, the concave base housing 306 may be formed of an electrical conductor, and the base conductor 314 and the cathode bonding wire 318 may be omitted. It will be appreciated that in an alternative example structure for the NPCLD, the semiconductor body 312 may be p-doped and the semiconductor body 310 may be n-doped. A current flow through the LED 308 in such an alternative structure may be reversed, so that the NPCLD 300 may include an anode 304 and a cathode 302. In another implementation example, the cathode 304 is replaced by a first terminal 304 at a relatively high electrical potential in signal communication with the p-doped semiconductor body 310; and the anode 302 is replaced by a second terminal 302 at a relatively low electrical potential in signal communication with the n-doped semiconductor body 312.

The LED 308 may be substantially covered by a first diffused lens body 322 formed from a composition including diffusant particles and an encapsulant. The diffusant particles may be, for example, particles of a metal oxide such as titanium dioxide or silicon dioxide. The first diffused lens body 322 has a substantially flat upper surface 324. It is appreciated that the phrase "substantially flat" means that the upper surface 324 of the first diffused lens body 322 has a generally flat shape, which may include minor imperfections. A phosphor body 326 is deposited on the substantially flat upper surface 324, having a first substantially convex upper surface 328. The substantially flat upper surface 324 on which the phosphor body 326 is deposited, allows the phosphor to sink evenly through the encapsulant. In this manner, differential concentrations of phosphor across the substantially flat upper surface 324 are minimized. In addition, deposition of the phosphor body 326 onto the substantially flat upper surface 324 permits precise control over the effective thickness in the direction 330 of the phosphor within the phosphor body 326. This precise thickness control enables precise adjustment of the spectral ratio of photons emitted by the NPCLD 300, in turn enabling control over the appearance of the color of the photonic output to the human eye. Furthermore, the first convex upper surface (i.e., the domed surface) 328 of the phosphor body 326 facilitates generation of substantially uniform intensities of photons passing through the first domed surface 328. The side inner wall 332 and base inner wall 334 of the concave base housing 306 form a reflector for the photons emitted by the LED 308 and by the phosphor body 326, and deflect these photons in the direction 330 of maximum photonic radiation of the NPCLD 300. The side inner wall 332 may have a circular circumference. The anode 302 and cathode 304 of the NPCLD 300 may be supported on a base 336, and collectively encapsulated in a second lens 338 that may be a diffused lens, having a second domed surface 340 forming a substantially convex lens for example photonic emissions 342, 344, 346 and 348 from the NPCLD 300. In an implementation example, the second lens 338 may not be a diffused lens.

Figure 4:
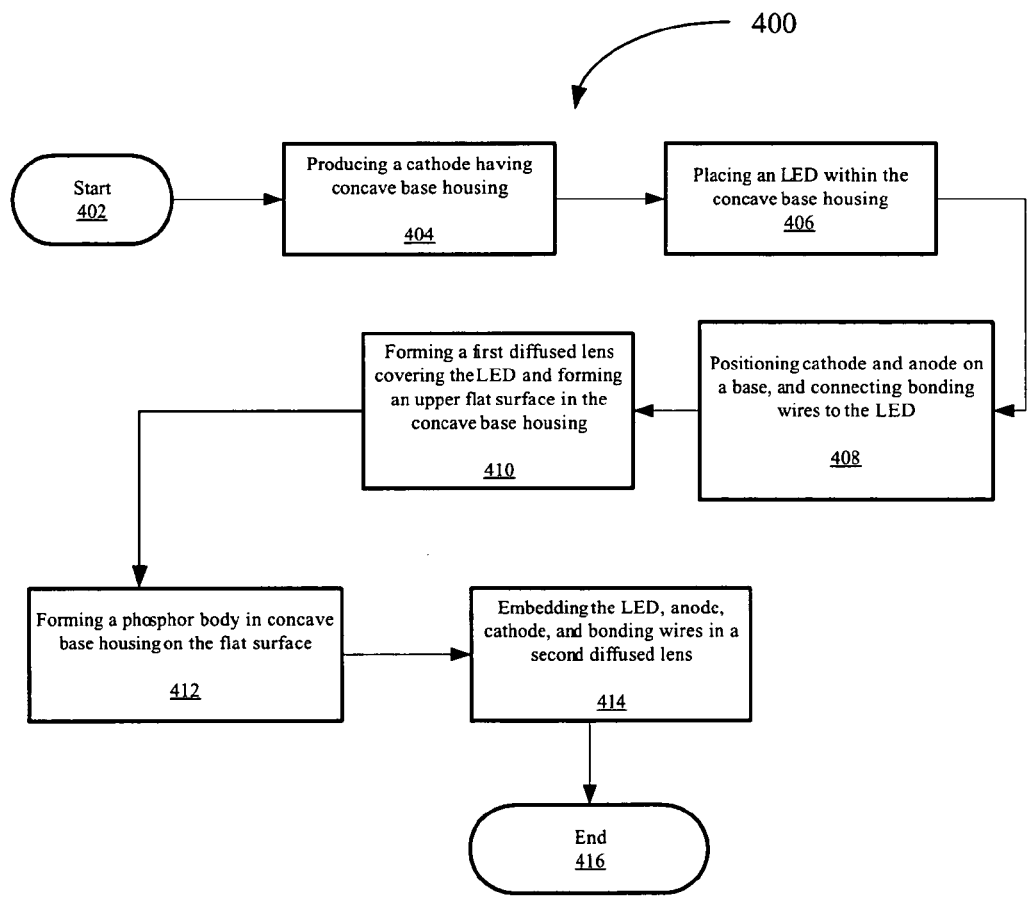
FIG. 4 shows a flowchart illustrating an example of an implementation of a method for fabricating the NPCLD shown in FIG. 3.

FIG. 4 shows flowchart 400 illustrating an example of an implementation of a method for fabricating the new NPCLD 300 shown in FIG. 3. The process begins at step 402 and in step 404, a cathode 304 having a concave base housing 306 is produced. The concave base housing 306 has a photon-reflective side inner wall 332 and a base inner wall 334, shown in FIG. 3. In step 406, an LED 308 is placed within the concave base housing 306 on the base inner wall 334. In one implementation of a method, the LED 308 may be placed at a point on the base inner wall 334 substantially equidistant from all points at which side inner wall 332 meets base inner wall 334. In step 408, the cathode 304 and anode 302 are positioned on a base 336, and bonding wires 318 and 320 are connected from the base conductor 314 to the cathode 304 and from the top conductor 316 to the anode 302, respectively. Again, it is appreciated that all or a portion of step 408 may be performed later in the process. In step 410, a first diffused lens body 322 is placed within the concave base housing 306, substantially covering the LED 308 and forming the substantially flat upper surface 324. The first diffused lens body 322 may be formed from the same composition as discussed above in connection with step 212 of FIG. 2. A phosphor-encapsulant composition is formulated as earlier discussed. In step 412, the phosphor body 326 is formed on the substantially flat upper surface 324, having a first substantially convex upper surface 328. As an example, the phosphor body 326 may be molded or cast into any desired shape. In step 414, the LED 308, anode 302, cathode 304, and bonding wires 318 and 320 of the NPCLD 300 are embedded in the second lens 338. The process then ends in step 416. As an example of an implementation, the second lens 338 is fabricated from an encapsulant as earlier discussed, having dispersed light-scattering particles such as titanium dioxide or silicon dioxide particles. The second lens 338 may be formed with the desired dome shape, for example, by molding or casting.

Figure 5:
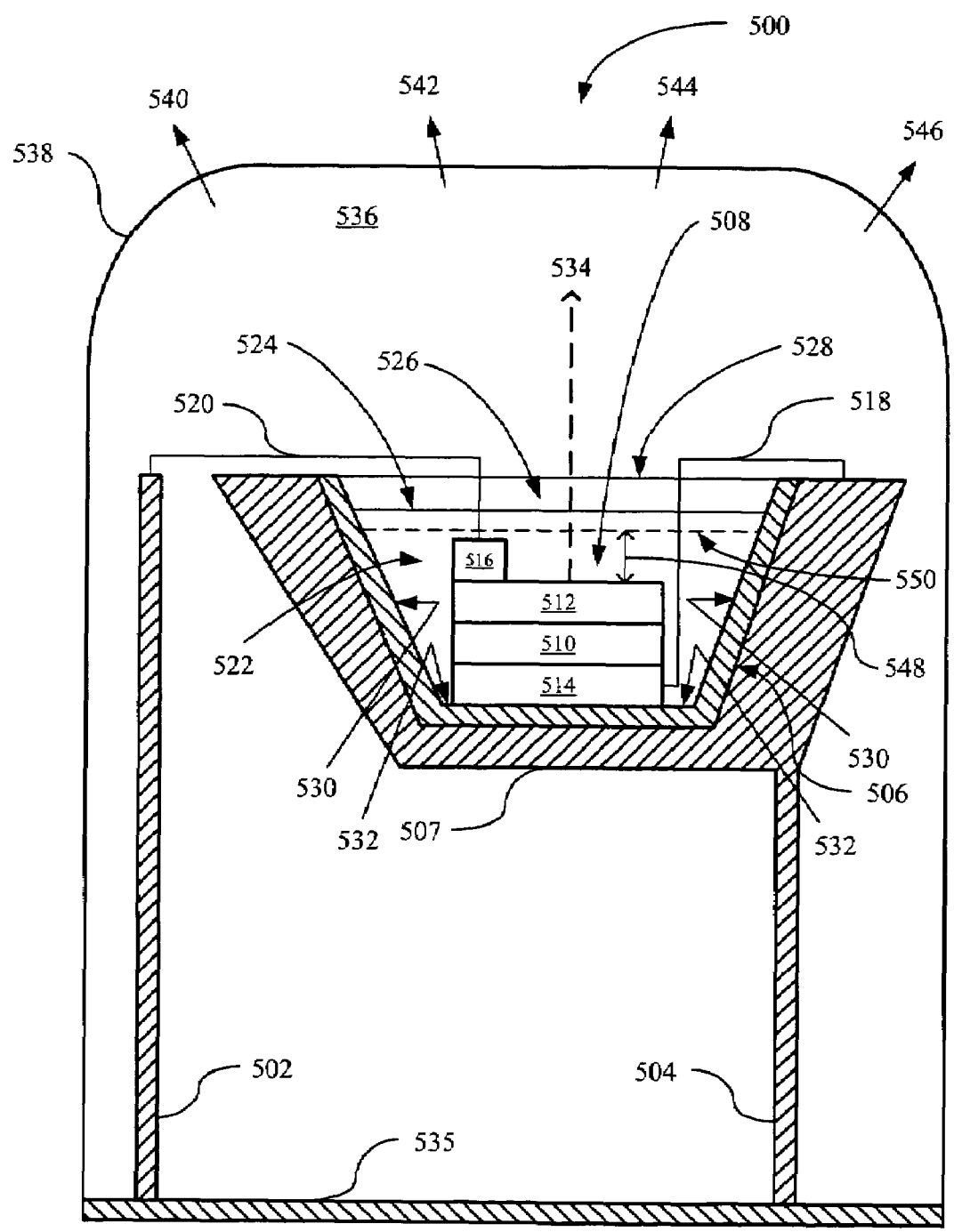
FIG. 5 shows a cross-sectional view of an example of yet another implementation of the NPCLD.

In FIG. 5, a cross-sectional view of an example of another implementation of a new NPCLD 500 is shown. The NPCLD 500 includes an anode 502, and a cathode 504. The cathode 504 includes a concave base housing 506 formed of an electrical insulator and supported on a frame 507, in which an LED 508 is placed. The frame 507 may be integrated with the cathode 504, and may be fabricated, for example, from lead or another material as earlier discussed. The LED 508 includes a p-doped semiconductor body 510 and an n-doped semiconductor body 512. In an example of an implementation, more than one LED 508 may be placed in the concave base housing.

The p-doped semiconductor body 510 may be in signal communication with a base conductor 514 and the n-doped semiconductor body 512 may be in signal communication with a top conductor 516. The base conductor 514 and top conductor 516 allow current to flow in and out of the p-doped semiconductor body 510 and n-doped semiconductor body 512, respectively. A cathode bonding wire 518 may electrically connect the cathode 504 to the base conductor 514 placing the cathode 504 in signal communication with the base conductor 514. Similarly, an anode bonding wire 520 may electrically connect the anode 502 to the top conductor 516. In an alternative implementation example, the concave base housing 506 may be formed of an electrical conductor, and the base conductor 514 and the cathode bonding wire 518 may be omitted. In an example of an implementation, more than one cathode bonding wire 518 and/or more than one anode bonding wire 520 may be used. It will be appreciated that in an alternative example structure for the NPCLD, the semiconductor body 512 may be p-doped and the semiconductor body 510 may be n-doped. A current flow through the LED 508 in such an alternative structure may be reversed, so that the NPCLD 500 may include an anode 504 and a cathode 502. In another implementation example, the cathode 504 is replaced by a first terminal 504 at a relatively high electrical potential in signal communication with the p-doped semiconductor body 510; and the anode 502 is replaced by a second terminal 502 at a relatively low electrical potential in signal communication with the n-doped semiconductor body 512.

The LED 508 may be substantially covered by a phosphor body 522 formed from a composition including a phosphor and an encapsulant. The phosphor body 522 has a substantially flat upper surface 524. A first diffused lens 526 having a substantially flat upper surface 528 is placed on the phosphor body 522. The first diffused lens 526 disperses photons across the surface 528, reducing imbalances in photonic intensity and photonic spectral ratios. The side inner wall 530 and base inner wall 532 of the concave base housing 506 form a reflector for the photons emitted by the LED 508 and by the phosphor body 522, and deflect these photons in the direction 534 of maximum photonic radiation of the NPCLD 500. The base inner wall 532 may have a circular circumference. The anode 502 and cathode 504 of the NPCLD 500 may be supported on a base 535, and collectively encapsulated in a second lens 536, which may be a diffused lens, having a domed surface 538 forming a substantially convex lens for example photonic emissions 540, 542, 544, and 546 from the NPCLD 500. In an implementation example, the second lens 536 may not be a diffused lens.

In an example of an implementation, the phosphor in the composition utilized to form the phosphor body 522 is of sufficient concentration and amount to substantially cover the LED 508. Furthermore in this example, the phosphor may be selected to have a relatively higher density than the encapsulant in which it is dispersed, so that the phosphor sinks to the bottom of the phosphor body 522. In this example, the phosphor covers the LED 508 by a minimum distance "x," shown by the arrow 548, which is sufficiently great such that the phosphor forms a sub-body within the phosphor body 522, having a substantially flat upper surface indicated by the dotted line 550. This substantially flat upper surface reduces irregularities in the intensity and spectral ratios of photons reaching the substantially flat upper surface 524.

Figure 6:
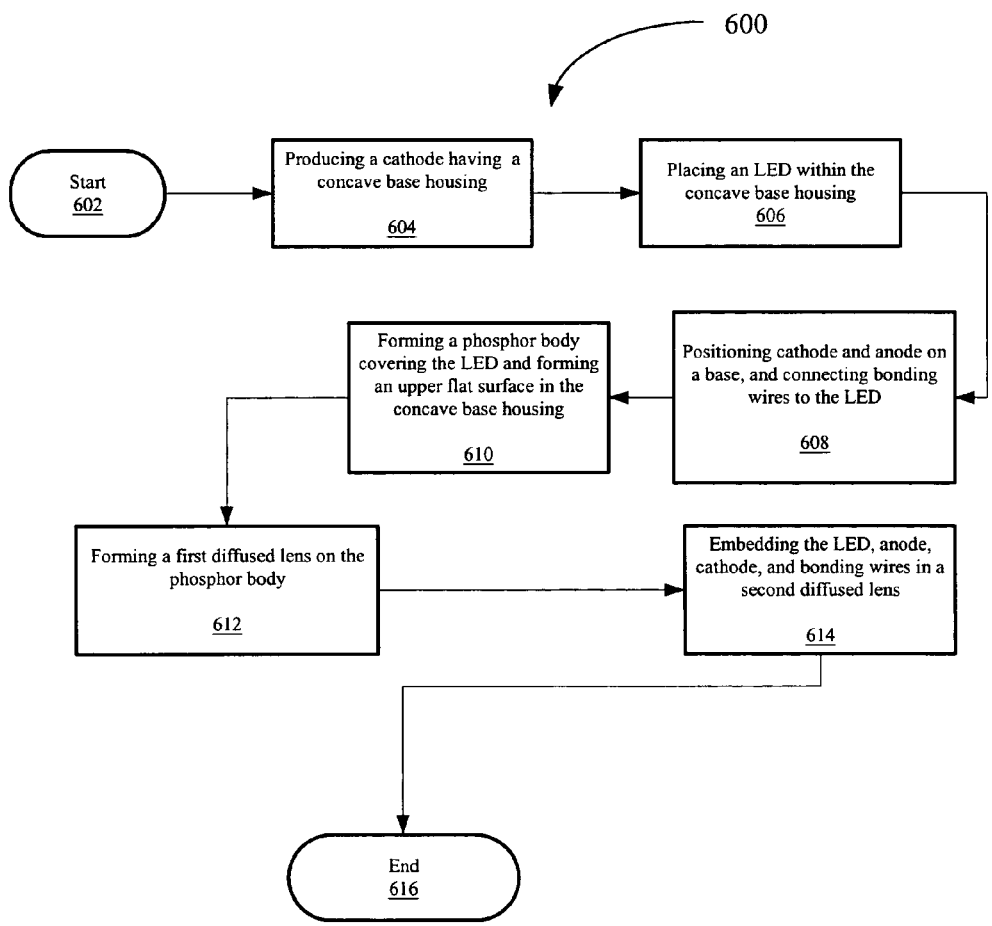
FIG. 6 shows a flowchart illustrating an example of an implementation of a method for fabricating the NPCLD shown in FIG. 5.

In FIG. 6, a flowchart 600 illustrating an example of an implementation of a method for fabricating the new NPCLD 500 of FIG. 5 is shown. The process begins in step 602, and in step 604, a cathode 504 having the concave base housing 506 is produced, wherein the concave base housing 506 has photon-reflective side inner wall 530 and base inner wall 532. An LED 508 is placed within the concave base housing 506 on the base inner wall 532, in step 606. The LED 508 may be positioned at a point on the base inner wall 532 substantially equidistant from all points at which base inner wall 532 meets side inner wall 530. In step 608, the cathode 504 and anode 502 are positioned on a base 535, and bonding wires 518 and 520 are connected to the conductors 514 and 516 and to the cathode 504 and anode 502, respectively. Again, it is appreciated that either all or a portion of step 608 may be performed later in the process 600 without departing from the method. A phosphor-encapsulant composition is formulated as earlier discussed in FIGS. 2 and 4. In step 610, a phosphor body 522 is formed within the concave base housing 506 on the LED 508. In this example, the phosphor body 522 is formed to have the substantially flat upper surface 524 shown in FIG. 5. In an example of an implementation, the concentration and amount of phosphor in the phosphor-encapsulant composition is sufficiently high so that upon formation of the phosphor body 522, sufficient phosphor is deposited within the concave base housing 506 to substantially cover the LED 508 as shown by the dotted line 550. In step 612, a first diffused lens 526 is formed on the phosphor body 522, having a substantially flat upper surface 528. In an implementation example, the first diffused lens 526 may be fabricated from an encapsulant as earlier discussed, having dispersed light-scattering particles such as titanium dioxide or silicon dioxide particles. The first diffused lens 526 may be formed, for example, by dispensing a curable composition including light scattering particles dispersed in an encapsulant. Alternatively, the first diffused lens 526 may be screen-printed, or pre-formed as a solid film and attached onto the phosphor body 522. In step 614, the LED 508, anode 502, cathode 504, and bonding wires 518 and 520 of the NPCLD 500 are embedded in the second lens 536. The second lens 536 may be formed with a dome shape, for example, by molding or casting. The process then ends in step 616.

Figure 7:
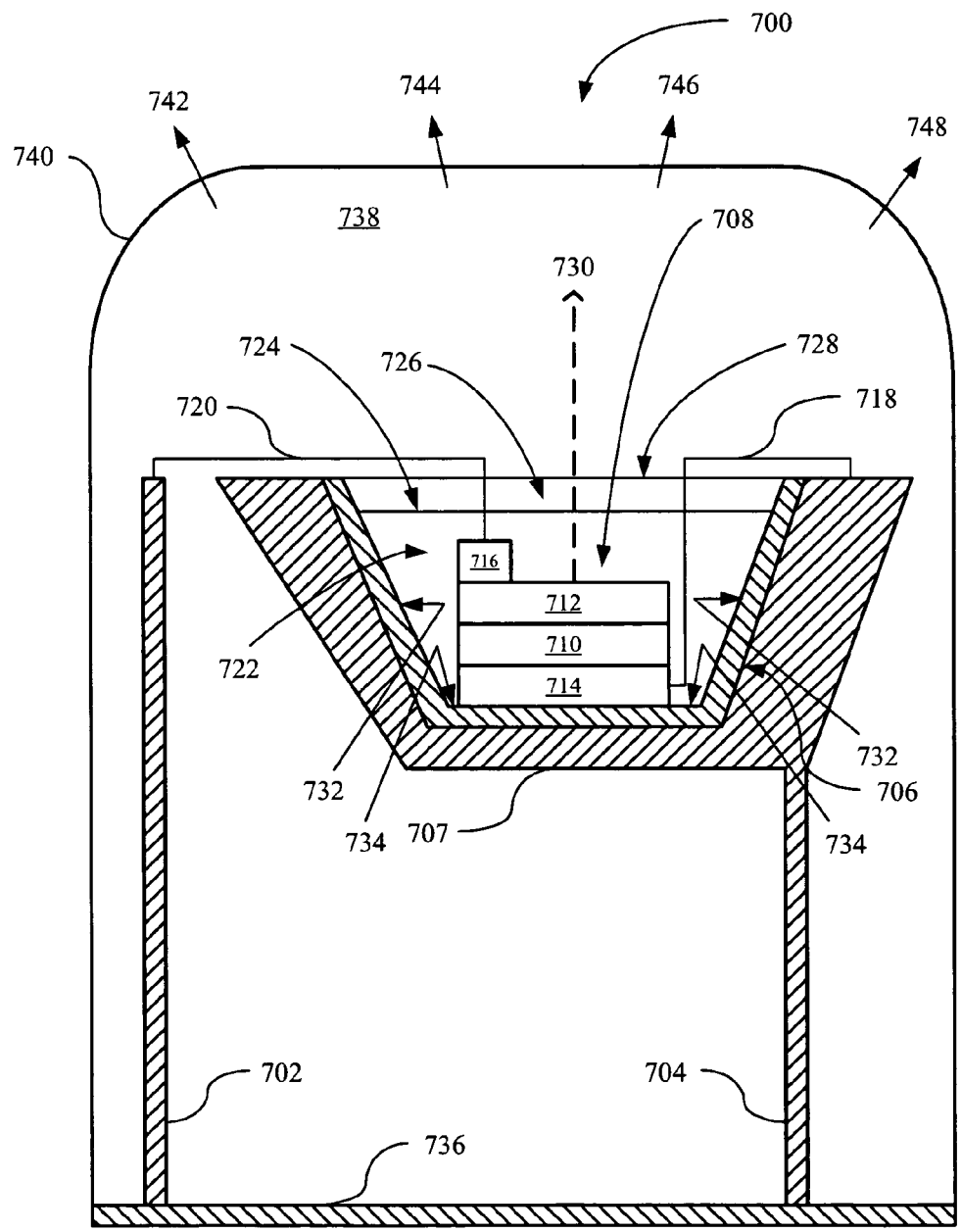
FIG. 7 shows a cross-sectional view of an example of yet another implementation of the NPCLD.

In FIG. 7, a cross-sectional view of an example of yet another implementation of a new NPCLD 700 is shown. The NPCLD 700 includes an anode 702, and a cathode 704. The cathode 704 includes a concave base housing 706 formed of an electrical insulator and supported on a frame 707, in which an LED 708 is placed. The frame 707 may be integrated with the cathode 704 and may be fabricated, for example, from lead or another material as earlier discussed. The LED 708 includes a p-doped semiconductor body 710 and an n-doped semiconductor body 712. In an example of an implementation, more than one LED 708 may be placed in the concave base housing 706.

The p-doped semiconductor body 710 may be in signal communication with a base conductor 714 and the n-doped semiconductor body 712 may be in signal communication with a top conductor 716. The base conductor 714 and top conductor 716 allow current to flow in and out of the p-doped semiconductor body 710 and n-doped semiconductor body 712, respectively. A cathode bonding wire 718 may electrically connect the cathode 704 to the base conductor 714 placing the cathode 704 in signal communication with the base conductor 714. Similarly, an anode bonding wire 720 may electrically connect the anode 702 to the top conductor 716. In an alternative implementation example, the concave base housing 706 may be formed of an electrical conductor, and the base conductor 714 and the cathode bonding wire 718 may be omitted. In an example of an implementation, more than one cathode bonding wire 718 and/or more than one anode bonding wire 720 may be used. It will be appreciated that in an alternative example structure for the NPCLD, the semiconductor body 712 may be p-doped and the semiconductor body 710 may be n-doped. A current flow through the LED 708 in such an alternative structure may be reversed, so that the NPCLD 700 may include an anode 704 and a cathode 702. In another implementation example, the cathode 704 is replaced by a first terminal 704 at a relatively high electrical potential in signal communication with the p-doped semiconductor body 710; and the anode 702 is replaced by a second terminal 702 at a relatively low electrical potential in signal communication with the n-doped semiconductor body 712.

The LED 708 is substantially covered by a first diffused lens 722 having a substantially flat upper surface 724. A phosphor body 726 formed from a composition including a phosphor and an encapsulant is deposited on the first diffused lens 722. The phosphor body 726 has a substantially flat upper surface 728. The first diffused lens 722 disperses photons across the surface 728, reducing imbalances in photonic intensity and photonic spectral ratios. The substantially flat upper surface 724 on which the phosphor body 726 is formed, ensures that as the phosphor sinks through the encapsulant, it does so evenly across the substantially flat upper surface 724. In this manner, differential concentrations of phosphor across the substantially flat upper surface 724 are minimized. In addition, deposition of the phosphor body 726 onto the substantially flat upper surface 724 permits precise control over the effective thickness in the direction 730 of the phosphor within the phosphor body 726. This precise thickness control enables precise adjustment of the spectral ratio of photons emitted by the NPCLD 700, in turn enabling control over appearance of the color of the photonic output to the human eye. The side inner wall 732 and base inner wall 734 of the concave base housing 706 form a reflector for the photons emitted by the LED 708 and by the phosphor body 722, and deflect these photons in the direction 730 of maximum photonic radiation of the NPCLD 700. The base inner wall 734 may have a circular circumference. The anode 702 and cathode 704 of the NPCLD 700 may be supported on a base 736, and collectively encapsulated in a second lens 738, which may be a diffused lens, having a domed surface 740 forming a substantially convex lens for example photonic emissions 742, 744, 746, and 748 from the NPCLD 700. In an implementation example, the second lens 738 may not be a diffused lens.

Figure 8:
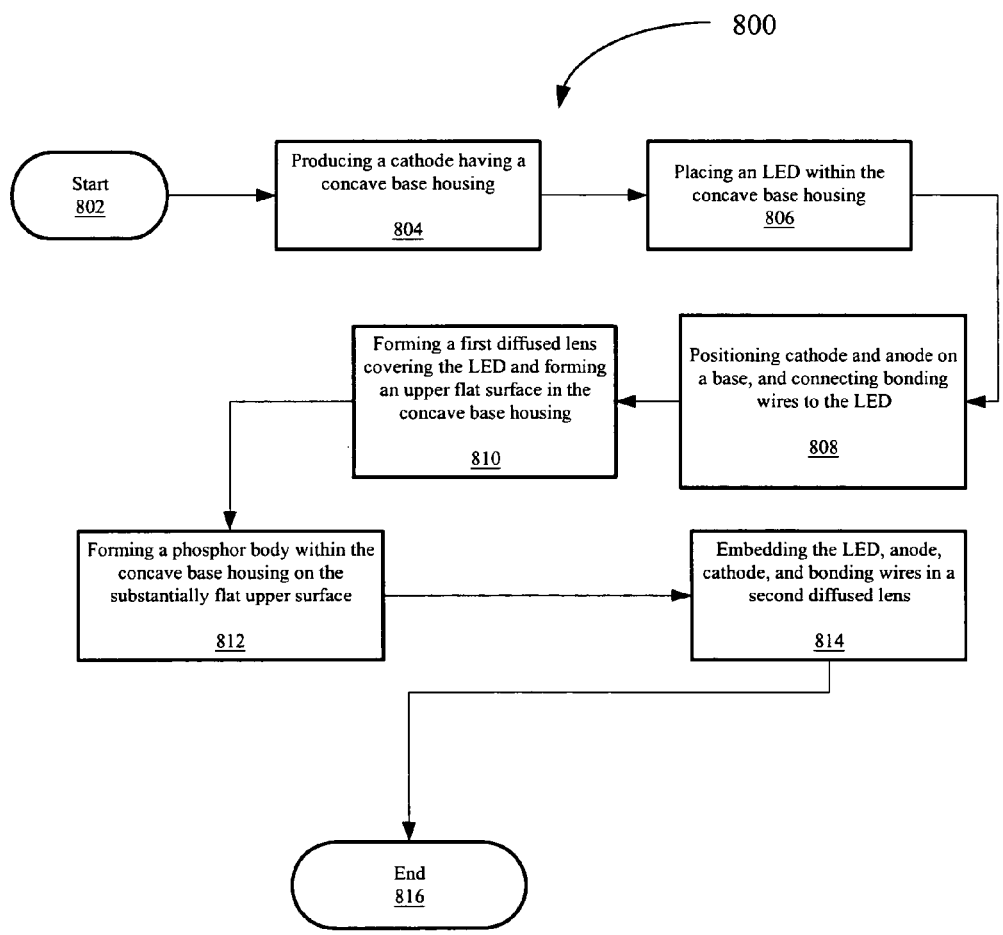
FIG. 8 shows a flowchart illustrating an example of an implementation of a method for fabricating the NPCLD shown in FIG. 7.

In FIG. 8, a flowchart 800 is shown that illustrates an example of an implementation of a method for fabricating the new NPCLD 700 of FIG. 7. The process begins in step 802, and in step 804, a cathode 704 having a concave base housing 706 is produced, wherein the concave base housing 706 has photon-reflective side inner wall 732 and base inner wall 734. An LED 708 is placed within the concave base housing 706 on the base inner wall 734, in step 806. The LED 708 may be positioned at a point on the base inner wall 734 substantially equidistant from all points at which base inner wall 734 meets side inner wall 732. In step 808, the cathode 704 and anode 702 are positioned on a base 736, and bonding wires 718 and 720 are connected to the conductors 714 and 716 and to the cathode 704 and anode 702, respectively. Again, it is appreciated that either all or a portion of step 808 may be performed later in the process without departing from the method. In step 810, a first diffused lens 722 is formed within the concave base housing 706 on the LED 708, having a substantially flat upper surface 724. As an example, the diffused lens 722 may be fabricated from an encapsulant as earlier discussed, having dispersed light-scattering particles such as titanium dioxide or silicon dioxide particles. Similar to the processes described in FIGS. 2, 4, and 6, a phosphor-encapsulant composition is formulated as earlier discussed. In step 812, the phosphor body 726 is formed within the concave base housing 706 on the substantially flat upper surface 724. In this example, the phosphor body 726 may be formed to have a substantially flat upper surface 728. In an example of an implementation, the phosphor body 726 may be fabricated from an encapsulant as earlier discussed, having dispersed phosphor. The phosphor body 726 may be formed, for example, by dispensing a curable composition including the phosphor dispersed in an encapsulant. Alternatively, the phosphor body 726 may be screen-printed, or pre-formed as a solid film and attached onto the diffused lens 722. In step 814, the LED 708, anode 702, cathode 704, and bonding wires 718 and 720 of the NPCLD 700 are embedded in a second lens 738. The second lens 738 may be formed with the desired dome shape, for example, by molding or casting. The process then ends in step 816.

While the foregoing description refers to the use of an LED emitting blue photons to stimulate luminescent emissions from a yellow phosphor in order to produce output light having a white appearance, the subject matter is not limited to such a device. Any phosphor-converted LED device that could benefit from the functionality provided by the components described above may be implemented in the NPCLDs disclosed herein and shown in the drawings.

Moreover, it will be understood that the foregoing description of numerous implementations has been presented for purposes of illustration and description. This description is not exhaustive and does not limit the claimed inventions to the precise forms disclosed. Modifications and variations are possible in light of the above description or may be acquired from practicing the invention. The claims and their equivalents define the scope of the invention.

What is claimed:

1. A New Phosphor-Converted LED Device ("NPCLD"), comprising:
   a concave base housing;
   a light emitting diode ("LED") in the concave base housing, the LED having a p-doped semiconductor body and an n-doped semiconductor body;
   a phosphor body over the LED, the phosphor body having a substantially flat upper surface;
   a first lens over the LED, the first lens having a substantially flat upper surface; and
   a second lens over the phosphor body and over the first lens, the second lens having a substantially convex upper surface; and
   the first lens and the phosphor body together having a substantially flat interface.

2. The NPCLD of claim 1, wherein the phosphor body is interposed between the LED and the first lens.

3. The NPCLD of claim 1, wherein the phosphor body includes
   a phosphor and
   an encapsulant,
   wherein the phosphor substantially covers the LED.

4. The NPCLD of claim 1, wherein the first lens is interposed between the LED and the phosphor body.

5. The NPCLD of claim 1, wherein:
   the LED has an emission maximum within a range of about 420 nanometers to about 490 nanometers, the n-doped semiconductor body and the p-doped semiconductor body each including a member selected from the group consisting of gallium nitride, indium-gallium-nitride, gallium-aluminum-indium-nitride, and mixtures; and
   the phosphor has an emission maximum within a range of about 550 nanometers to about 585 nanometers, the phosphor including a cerium-doped yttrium-aluminum garnet, including
   at least one element selected from the group consisting of yttrium, lutetium, selenium, lanthanum, gadolinium, samarium, and terbium; and
   at least one element selected from the group consisting of aluminum, gallium, and indium.

6. The NPCLD of claim 1, further including:
   a first terminal at a relatively high electrical potential in signal communication with the p-doped semiconductor body; and
   a second terminal at a relatively low electrical potential in signal communication with the n-doped semiconductor body.

7. A method for fabricating a New Phosphor-Converted LED Device ("NPCLD"), the method comprising:
   producing a concave base housing;
   placing a light emitting diode ("LED") in the concave base housing, the LED having a p-doped semiconductor body and an n-doped semiconductor body;
   forming a phosphor body over the LED;
   forming a first lens over the LED, the first lens having a substantially flat upper surface; and
   forming a second lens over the phosphor body and over the first lens, the second lens having a substantially convex upper surface; and
   shaping the first lens and the phosphor body to have a substantially flat interface.

8. The method of claim 7, further including interposing the phosphor body between the LED and the first lens.

9. The method of claim 7, further including substantially covering the LED with phosphor.

10. The method of claim 7, further including interposing the first lens between the LED and the phosphor body.

11. The method of claim 10, further including shaping the phosphor body to have a substantially convex upper surface.

12. The method of claim 7, wherein:

the LED has an emission maximum within a range of about 420 nanometers to about 490 nanometers, the n-doped semiconductor body and the p-doped semiconductor body each including a member selected from the group consisting of gallium nitride, indium-gallium-nitride, gallium-aluminum-indium-nitride, and mixtures; and the phosphor has an emission maximum within a range of about 550 nanometers to about 585 nanometers, the phosphor including a cerium-doped yttrium-aluminum garnet, further including at least one element selected from the group consisting of yttrium, lutetium, selenium, lanthanum, gadolinium, samarium and terbium, and at least one element selected from the group consisting of aluminum, gallium and indium.

* * * * *